United States Patent [19]
Nowak et al.

[11] Patent Number: 5,831,452
[45] Date of Patent: Nov. 3, 1998

[54] LEAK TOLERANT LOW POWER DYNAMIC CIRCUITS

[75] Inventors: Edward Joseph Nowak, Essex; Minh Ho Tong, Essex Junction; Lawrence G. Heller, South Burlington, all of Vt.

[73] Assignee: International Business Machines Corporation, Armonk, N.Y.

[21] Appl. No.: 803,582

[22] Filed: Feb. 20, 1997

[51] Int. Cl.[6] ............... H03K 19/0948; H03K 19/096
[52] U.S. Cl. ............... 326/98; 326/28; 326/121
[58] Field of Search ............... 326/98, 95, 28, 326/27, 112, 119, 121, 93, 113

[56] References Cited

U.S. PATENT DOCUMENTS 4,080,539  3/1978  Stewart .
5,065,048  11/1991 Asai et al. .
5,126,596  6/1992  Millman .
5,400,295  3/1995  Matsumura et al. .

*Primary Examiner*—Michael J. Tokar
*Assistant Examiner*—Qui Van Duong
*Attorney, Agent, or Firm*—Whitman, Curtis & Whitman; H. Jerry Walter, Esq.

[57] ABSTRACT

A novel precharge circuit is provided for dynamic CMOS logic circuits which are immune to leakage currents and reduce overall power consumption. The circuit comprises a precharge transistor for precharging a node to a high voltage level indicting a first logic state during a standby mode. Thereafter, during an active mode, the node may or may not be discharged by connected logic circuitry. If the node is discharged, then an additional transistor is provided to inhibit the precharging of the already charged node during a subsequent standby mode. Similarly, if the node is not discharged, a small keeper transistor is provided to keep the node at a fully precharged level.

12 Claims, 4 Drawing Sheets

LEAK TOLERANT LOW POWER DYNAMIC CIRCUITS

BACKGROUND OF THE INVENTION

1. Field of the Invention

The present invention generally relates to dynamic logic circuits and, more particularly, to dynamic logic circuits which are immune to leakage currents.

2. Description of the Related Art

Digital MOS circuits are generally classified as either static or dynamic depending on whether or not periodic clock signals are necessary to achieve an intended combinational logic function. Dynamic circuits are characterized as requiring a periodic clock signal, sometimes referred to as a precharge signal. The periodic precharge signal precharges a node to a logic high voltage level. Thereafter, natural parasitic capacitances or perhaps a designed "keeper" circuit holds the node at the logic high voltage level until discharged by a connected logic circuit. For example, a precharged node may indicate logic 0 and a discharged node may indicate a logic 1. Dynamic CMOS circuits provide an excellent combination of high density and low power consumption. Unfortunately, they are sensitive to leakage currents which can come from many sources and prematurely discharge the precharged node and erroneously indicate an incorrect logic level.

To illustrate this point, FIG. 1 shows a schematic of a typical dynamic two-input CMOS AND gate which is essentially comprised of a CMOS NAND gate in series with an inverter 10. Two inputs, A1 and A2, are provided, both of which must be high in order for the output OUT to be high. In stand-by mode, a precharge signal P (logic low) is input to the gate of PFET T1 thus turning T1 on and allowing node N to precharge to the power supply voltage Vdd. When the circuit is activated, the precharge signal P goes high thus turning the device T1 off. Node N is maintained at a high logic voltage during this time through a small "keeper" circuit comprising PFET T2. If both AND input signals A1 and A2 go high while the circuit is activated, the node N will be pulled to the ground causing the output signal OUT to go to a logic high due to the inverter 10. Hence, the logic AND function is realized.

The logical waveforms for the AND gate of FIG. 1 are shown in FIG. 2. As can be readily seen, there are two disadvantages to this circuit. First, if node N is pulled low (i.e. connected to ground), it will thereafter float in an undetermined state if either A1 or A2 are reset low before the next stand-by cycle. The circuit is therefore sensitive to leakage currents to Vdd as demonstrated at the right side of the waveforms shown in FIG. 2. Node N may leak high or leak low depending on its current logic state. Leakage currents come from many sources including $CoSi_2$ induced junction leakage, local interconnect (MC) overlapping, shallow trench isolation (STI) junction leakage, and across-chip linewidth variation ACLV-related sub-threshold current. Second, ac power is consumed by the precharge of the PFET T1 whether or not the node N is discharged in the previous cycle. This power is considerable considering the number of dynamic circuits per chip and the switching frequency.

There are several solutions which have been proposed for the first problem mentioned above. Two of such circuits are shown in FIGS. 3A and 3B. In FIG. 3A, a full keeper latch is used comprised of NFET T5 and PFET T2. In this case, the NFET T2 holds the node N high to Vdd as before. Similarly, the NFET T5 clamps node N at ground once node N is pulled low. Hence, Node N is prevented from floating.

The problem with this approach is that the precharge PFET T1 has to be large in order to flip the keeper latch during the next precharge cycle. Hence, the power consumption is increased.

The second approach, shown in FIG. 3B, is somewhat more elegant. Just as above, a full keeper latch comprising PFET T2 and NFET T5 is used to clamp the Node N to either Vdd or ground depending on the logic state of OUT. In addition, NFET T6 is provided having its gate connected to receive the precharge signal P. Thus, NFET T6 effectively flips the keeper latch rather than relying on a larger precharge transistor T1 as before. However, the ac power consumption still remains high in this case.

As is apparent, there exists a need in the art to have a dynamic CMOS circuit which is immune to leakage current without unduly increasing power consumption.

SUMMARY OF THE INVENTION

It is therefore an object of the present invention to provide a dynamic CMOS circuit which is immune to leakage current without unduly increasing power consumption.

It is yet another object of the present invention to provide a dynamic CMOS logic gate which is immune to leakage currents and has low power requirements.

According to the invention, a dynamic CMOS circuit is provided having an output fed back to a keeper latch in order to clamp the a logic node to either Vdd or ground depending on the logic state of the output. In addition, a novel precharge circuit is provided comprising two additional transistors connected to the gate of the precharge transistor. First, an additional PFET keeper transistor is added between Vdd and the gate of the precharge transistor in order to maintain the precharge node at a logic high when the connected logic circuitry does not discharge the precharge node. Second, an additional NFET transistor is added through which the precharge signal P is input to the gate of a precharge transistor. The output of the circuit is feed back to the gate of the small NFET transistor. The NFET transistor is used to discharge the gate of the precharge transistor during the standby cycle (i.e., the precharge signal P is low). Hence, the precharge transistor can be made large enough to flip the keeper latch without increasing the ac power consumption as described below.

The additional NFET is on during the precharge cycle only when the precharge node has been discharged low from the previous cycle. Otherwise, if the precharge node was not previously discharged, the additional NFET will remain off such that the precharge signal P only sees a very small gate-to-drain overlap capacitance. In other words, the precharge node need not be precharged again if it was never discharged. If a typical chip using dynamic circuits has 10% of the circuits selected per active cycle, the present invention is thereby immune to leakage current and drastically reduces ac power consumption.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
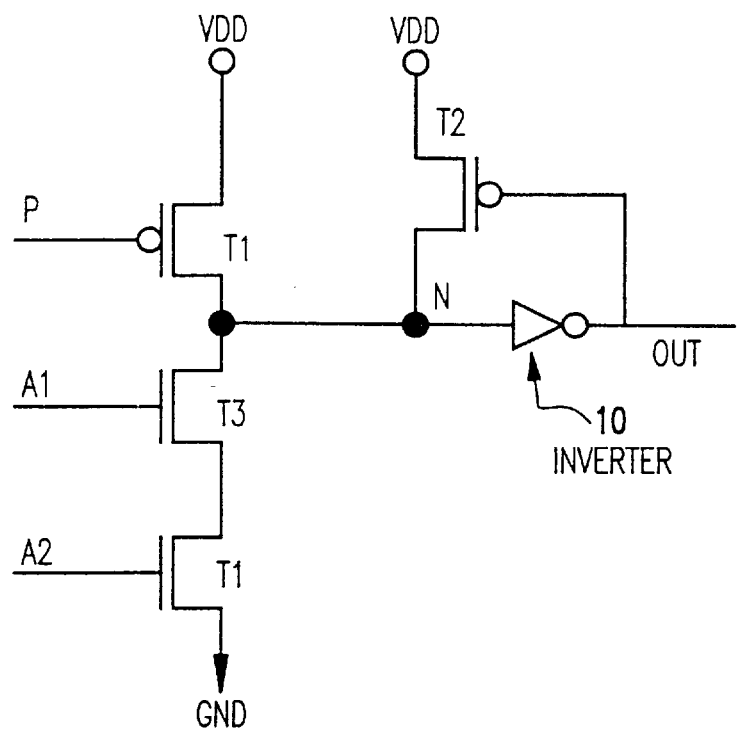
FIG. 1 is related art schematic of an exemplary dynamic CMOS AND gate.
Figure 2:
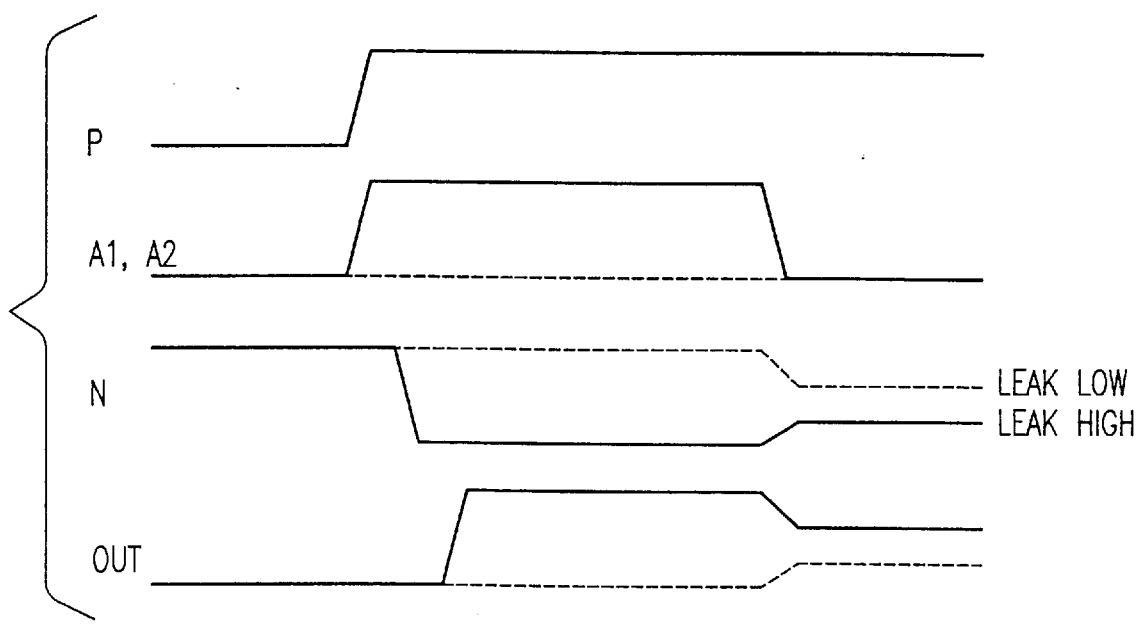
FIG. 2 is a waveform diagram illustrating the signal levels for the dynamic CMOS AND gate shown in FIG. 1.
Figure 3A:
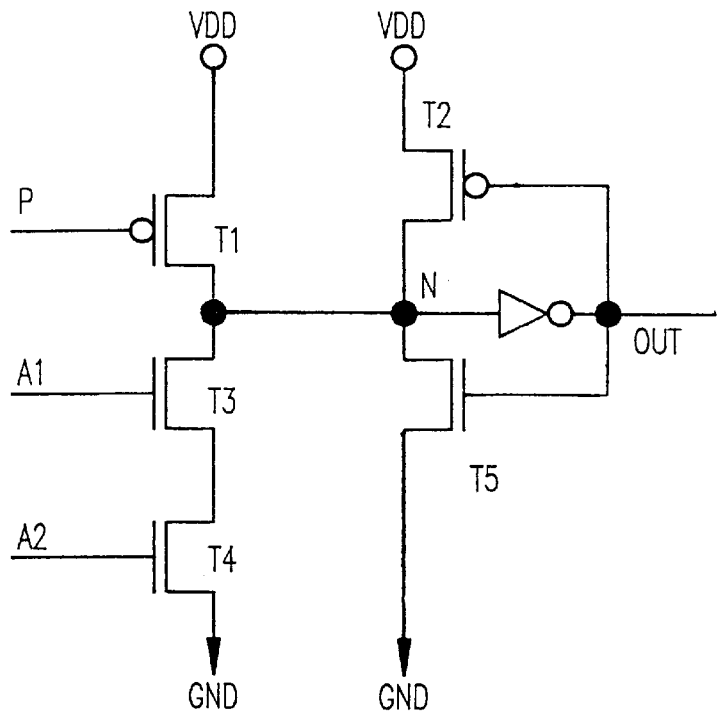
FIG. 3A is a related art dynamic CMOS AND gate similar to that shown in FIG. 1 including a full keeper latch.
Figure 3B:
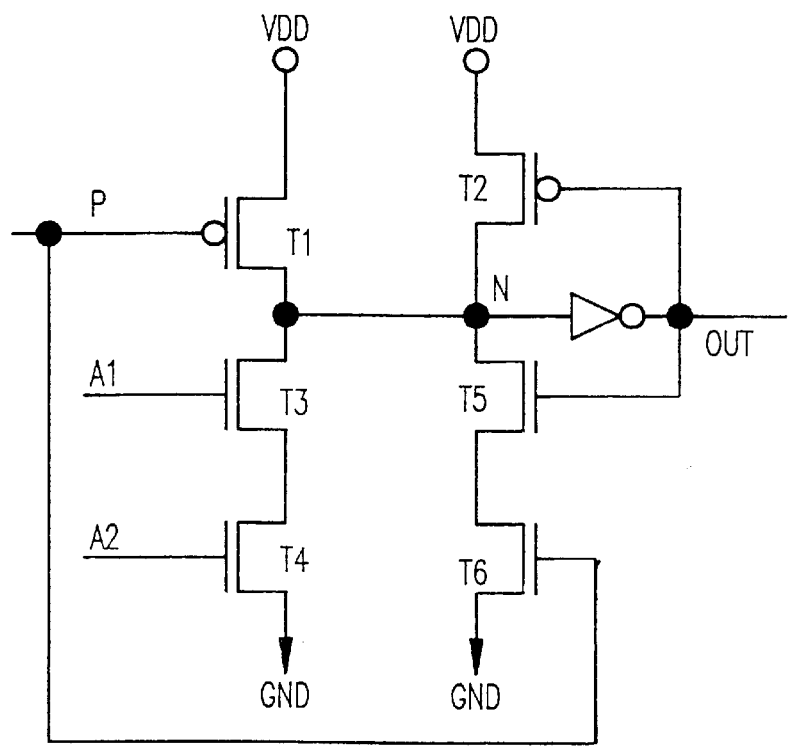
FIG. 3B is a related art dynamic CMOS AND gate similar to that shown in FIG. 3A including an NMOS transistor connected to the full keeper.
Figure 4A:
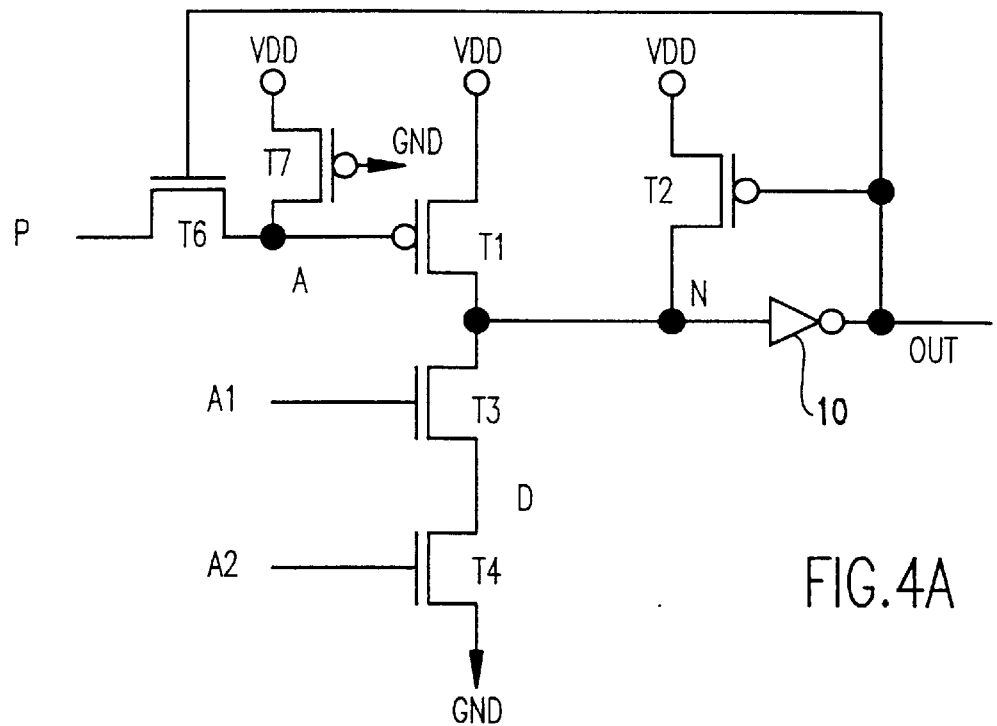
FIG. 4A dynamic CMOS circuit according to a first embodiment of the present invention comprising a complementary pair of transistors feeding the precharge transistor.

Referring now to the drawings, and more particularly to FIG. 4A, there is shown a dynamic circuit that offers both low ac power consumption and current leakage resistance. For illustrative purposes, a two-input AND gate is shown. However, the present invention can be extended to other dynamic CMOS logic circuits as well, such as, for example, NAND, NOR, OR or XOR gates.

Figure 4B:
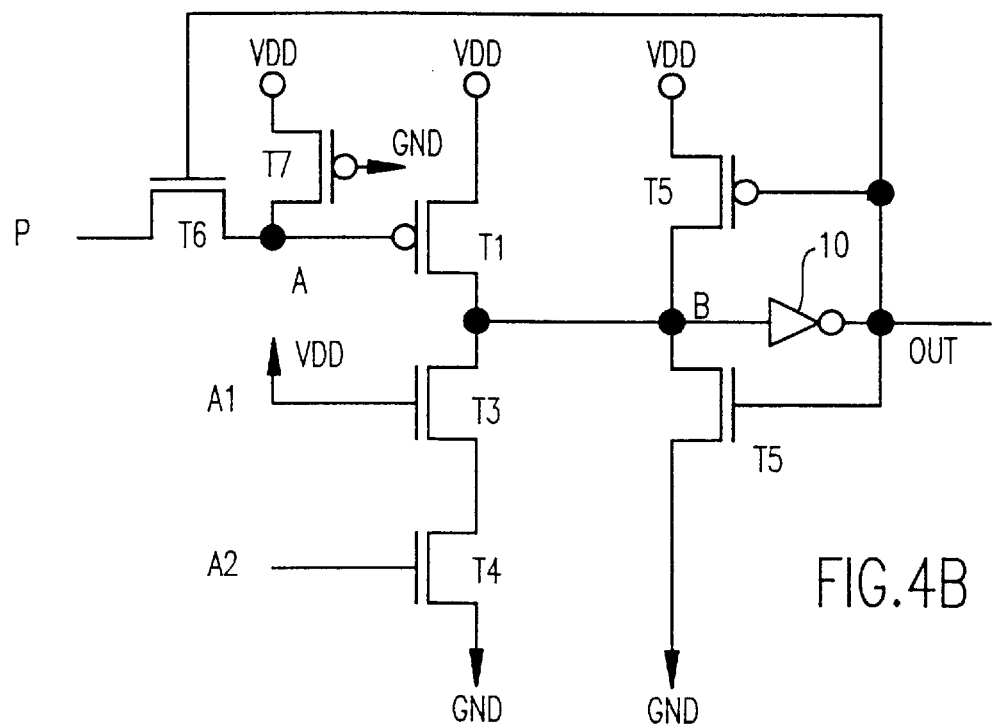
FIG. 4B is a dynamic CMOS circuit according to the first embodiment of the present invention including a full keeper latch.

Referring now to FIGS. 4A and 4B, there is shown the first embodiment of the present invention. By way of example, the dynamic logic circuit illustrated comprises an AND-gate. FIG. 4A shows the AND gate having a half-keeper latch comprising PFET T2, whereas FIG. 4B shows a full latch comprising T2 and T5, as described above. The AND-gate comprises two stacked NFETs, T3 and T4, and a precharge PFET T1. In addition, a small PFET keeper device T7 and an NFET T6 are connected to the precharge PFET T1. In operation, devices T3 and T4 perform the two-way AND logic function. That is, when the gates of both T3 and T4 are high, the precharge node B is discharged to ground and the output node OUT of the inverter 10 is high. Accordingly, if either the gate of T3 or T4 is low, the output node OUT is low.

The small keeper PFET T7 connects to Vdd and is used to keep the precharge node B high when the output signal out is low. Correspondingly, the NFET T6 is provided to discharge the node B during standby. The NFET T6 can be designed very small since it is not in the access delay path. During the precharge cycle, device T6 has to discharge node A to ground to turn on the precharge device T1. Since there is plenty of time during this cycle, the NFET T6 can be made small to save ac power. The PFET T1 can therefore be made large enough to flip the keeper latch without high power requirements. The NFET T6 is on during the precharge only when node B has been discharged low from the previous cycle. Otherwise, the NFET T6 will be off such that the precharge signal P only sees a very small gate-to-drain overlap capacitance. If a typical chip using dynamic circuits has 10% of the circuits selected per active cycle, the ac power can be drastically reduced.

For example, if the circuit was selected and both A1 and A2 became logic high during the previous active cycle, node B will be at a logic low (i.e., discharged to ground), and the node OUT will be high. Node B is clamped low by transistor T5 whose gate is high. On the other hand, if the circuit was not selected, then A1 and A2 did not go high to discharge node B to ground. Hence, PFET T2 will clamp node B high, since node OUT is low.

During the next stand-by cycle, the precharge signal P goes low to reset the circuit. If the circuit is not selected in the previous cycle, node B is high and node OUT is low. Since device T6 is off, there is very little power wasted by charging and discharging of the capacitances (i.e., the gate capacitances of T1 and T6, diffusion capacitances T6 and T7). If the circuit was selected during the active cycle, node B is now low and node OUT is high. Device T6 is on allowing node A to be discharged low by the precharge signal P. The small keeper T7 device will burn some small DC current during this time. Node B is precharged high by PFET T1. Node OUT then goes low to shut off T1. Node B is clamped high by T2. The power per selected circuit is high due to the high capacitance involved. However, if the number of selected circuits is small, i.e. 10–20% of the total, the overall power consumption is low.

Circuit simulations have been performed on a typical two-input AND circuit and the two-input AND circuit according to the present invention. Depending on the number of dynamic circuit switching per cycle, the ac power reduction can be 100%.

Figure 5A:
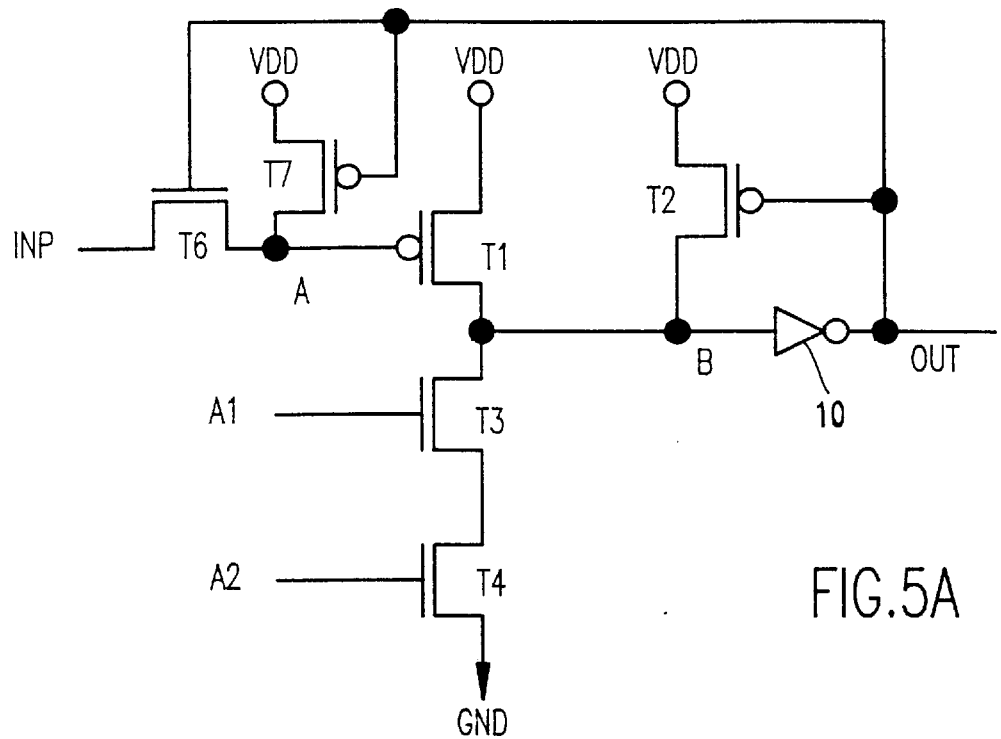
FIG. 5A is a dynamic CMOS circuit according to a second embodiment of the present invention comprising a complementary pair of transistors feeding the precharge transistor both of which receive a feedback signal from the circuit output.
Figure 5B:
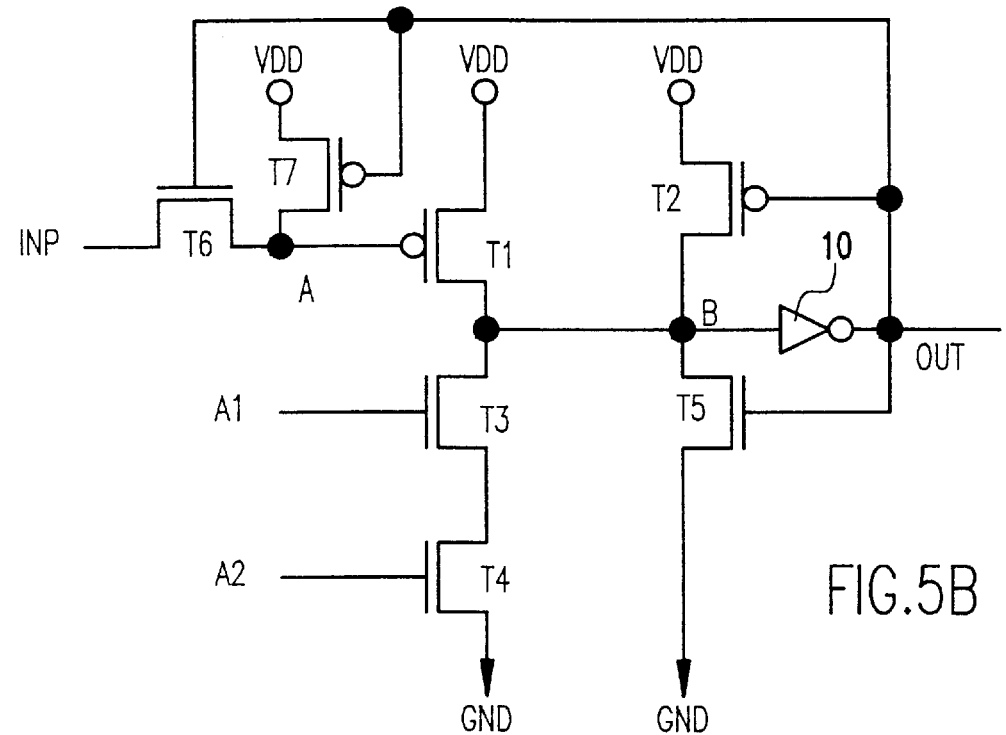
FIG. 5B is a dynamic CMOS circuit according to a second embodiment of the present invention further including a full keeper latch.

Referring now to FIGS. 5A and 5B, there is shown a second embodiment of the present invention. Here, the AND gates shown in FIGS. 5A and 5B are similar to those shown in FIGS. 4A and 4B, respectively. That is, FIG. 5A comprises a half keeper latch T2 and FIG. 5B shows a full keeper latch T2 and T5. However, in the second embodiment, the gate of the small keeper transistor T7 is connected to the output OUT rather than to Vdd as in the first embodiment. This configuration has a slight performance penalty due to the added capacitance at the output OUT. However, this configuration offers the advantage that dc power will not be consumed through the small keeper transistor T7.

While the invention has been described in terms of a single preferred embodiment, those skilled in the art will recognize that the invention can be practiced with modification within the spirit and scope of the appended claims.

We claim:

1. A dynamic logic circuit, comprising:

a precharge transistor connected to a power source for precharging a node for indicating a first logic level upon receiving a precharge signal;

discharge means for discharging said node to indicate a second logic level; and a switch for connecting said precharge signal to said precharge transistor, said switch connected to pass said precharge signal to said precharge transistor if said node has been previously discharged to said second logic state.

2. A dynamic logic circuit as recited in claim 1, further comprising:

a keeper transistor connected between said power source and a gate of said precharge transistor for keeping said node at said first logic level prior to discharging with said discharging means.

3. A dynamic logic circuit as recited in claim 2 wherein a gate of said keeper transistor is connected to electrical ground.

4. A dynamic logic circuit as recited in claim 2 wherein a gate of said keeper transistor is connected to an output of said dynamic logic circuit.

5. A dynamic logic circuit as recited in claim 3, further comprising a half keeper latch comprising a transistor connected between said power source and said node and having a gate connected to an output of said dynamic logic circuit.

6. A dynamic logic circuit as recited in claim 4, further comprising a full keeper latch comprising:

a first transistor connected between said power source and said node and having a gate connected to an output of said dynamic logic circuit; and a second transistor connected between said node and electrical ground, and having a gate connected to said output of said dynamic logic circuit.

7. A dynamic logic circuit as recited in claim 1 wherein said discharge means comprises an series of transistors for realizing a logical AND function.

8. A dynamic logic circuit as recited in claim 1 wherein said switch is a transistor smaller than said precharging transistor.

9. A precharge circuit for a dynamic CMOS circuit, comprising:

a precharge node for holding a first voltage level indicating a first logic state;

a precharge transistor connected between said precharge node and a voltage source;

a keeper transistor connected between a gate of said precharge transistor and said voltage source for keeping said precharge node at said first voltage level indicating said first logic state prior to discharge; and a switching transistor controlled by a feedback signal indicating a logic state of said precharge node, said switching transistor activating said precharge transistor during a stand-by cycle only if said precharge node has been previously discharged to a second voltage level indicating a second logic state.

10. A precharge circuit for a dynamic CMOS circuit as recited in claim 9 wherein a gate of said keeper transistor is connected to electrical ground.

11. A precharge circuit for a dynamic CMOS circuit as recited in claim 9 wherein a gate of said keeper transistor is connected to a output signal of said dynamic CMOS circuit.

12. A method for precharging a dynamic CMOS circuit, comprising the steps of:

precharging a node to a high voltage level indicating a first logic state during a stand-by mode;

discharging said node with connected logic circuitry if said logic circuitry is activated during an active mode;

precharging said node during a subsequent stand-by mode if said node was discharged during said discharging step; and inhibiting the precharging of said node during said subsequent stand-by mode if said node remains precharged from a previous standby mode.

* * * * *